United States Patent [19]

Stetz

[11] 4,150,990

[45] Apr. 24, 1979

[54] SMALL PHOSPHOR AREA BLACK MATRIX FABRICATING PROCESS

[75] Inventor: John W. Stetz, Waterloo, N.Y.

[73] Assignee: GTE Sylvania Incorporated, Stamford, Conn.

[21] Appl. No.: 868,453

[22] Filed: Jan. 10, 1978

[51] Int. Cl.$^2$ .......................... G03C 5/16; B05D 5/06
[52] U.S. Cl. ...................... 96/36.1; 96/117; 427/54; 427/68; 428/917
[58] Field of Search ............... 427/68, 54; 96/36.1, 96/117, 118; 428/917

[56] References Cited

U.S. PATENT DOCUMENTS

| | | | |
|---|---|---|---|
| 3,658,530 | 4/1972 | Hedler et al. | 96/36.1 |
| 3,712,815 | 1/1973 | Rohrer et al. | 96/36.1 |
| 3,788,846 | 1/1974 | Mayaud et al. | 96/36.1 |
| 3,837,855 | 9/1974 | Angelucci, Jr. | 427/68 |
| 3,858,083 | 12/1974 | Rehkopf et al. | 204/181 X |
| 3,891,440 | 6/1975 | Gallaro et al. | 96/36.1 |
| 3,917,794 | 11/1975 | Akagi et al. | 427/68 |
| 3,931,442 | 1/1976 | Rollason | 427/64 X |
| 3,965,278 | 6/1976 | Duinker et al. | 427/54 |
| 3,992,207 | 11/1976 | Barneveld et al. | 96/36.1 |

Primary Examiner—Michael R. Lusignan
Assistant Examiner—Thurman K. Page
Attorney, Agent, or Firm—Thomas H. Buffton

[57] ABSTRACT

A process for fabricating matrix cathode ray tubes having phosphor receiving areas smaller than the areas exposed through an apertured mask includes the steps of coating the inner surface of a viewing panel with a first film of photo-sensitive resist material; exposing the first film through an apertured mask to provide insolubilized areas of a given size; depositing a second film of resist material onto said first film; removing the second film, soluble areas of the first film, and portions of the insolubilized areas of the first film to provide insolubilized areas of the first film of a size smaller than said given size; overcoating with an opaque film, removing the overcoated insolubilized areas of a size smaller than the given size; and depositing phosphors in place of the removed insolubilized areas of a size smaller than said given size.

15 Claims, 9 Drawing Figures

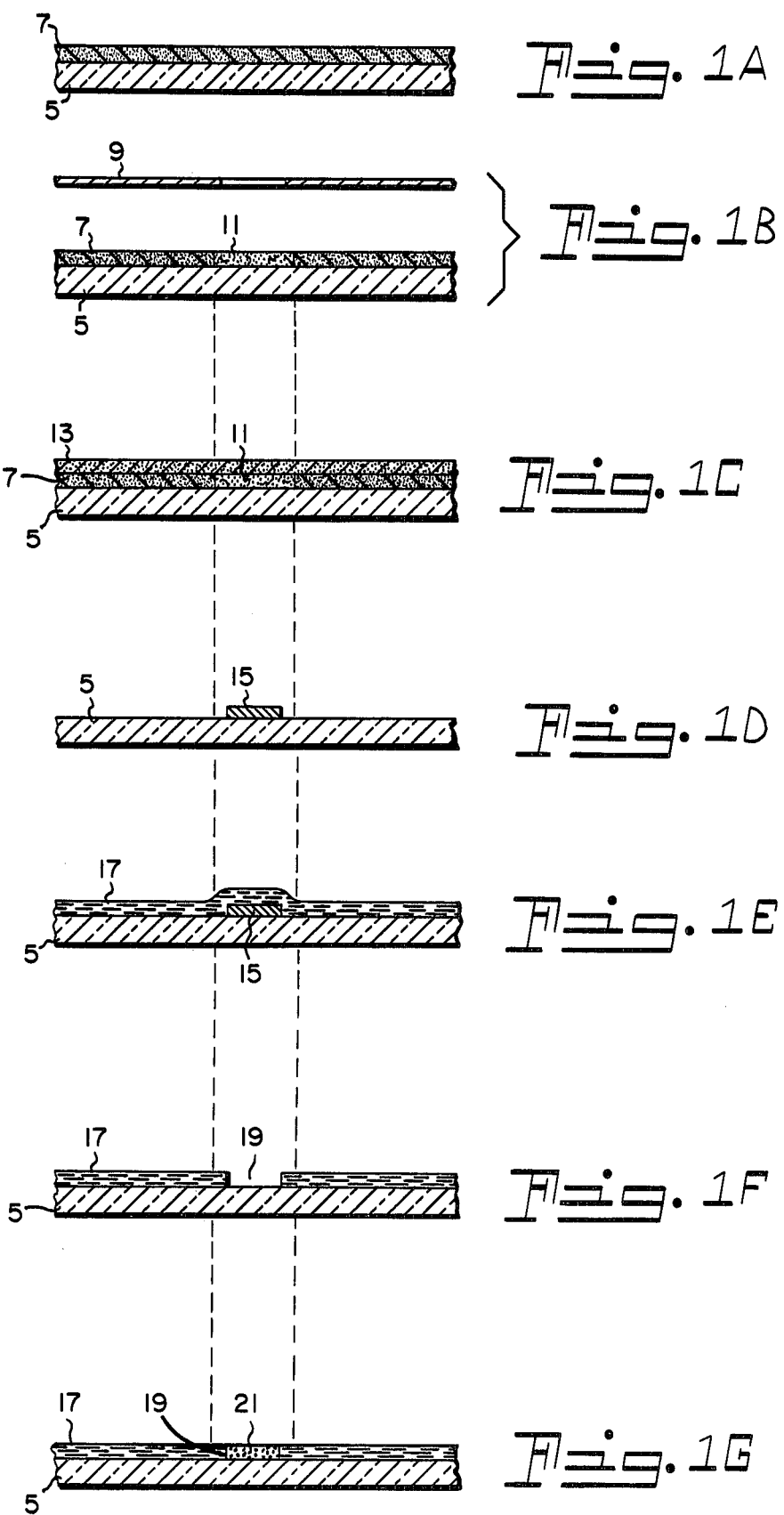

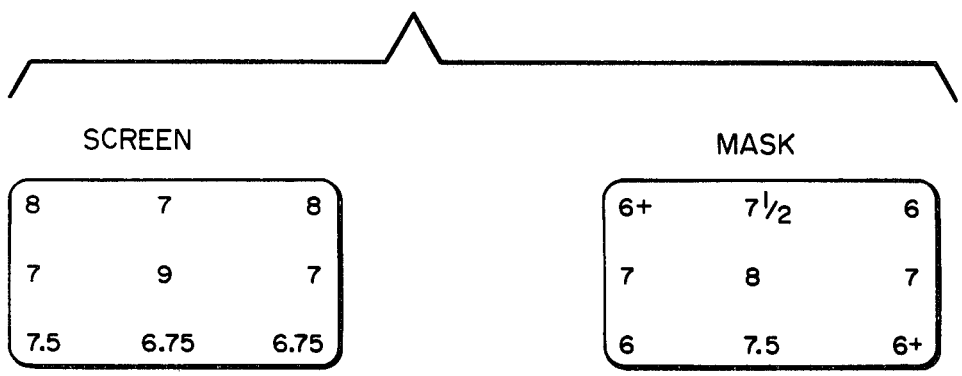

SMALL PHOSPHOR AREA BLACK MATRIX FABRICATING PROCESS

BACKGROUND OF THE INVENTION

This invention relates to cathode ray tubes and more particularly to a process for fabricating a black matrix screen structure having phosphor receiving areas smaller than a given exposure area effected by directing actinic radiation through an apertured mask.

Generally, matrix screen structures for cathode ray tubes are of either the positive or negative tolerance type. In the positive tolerance type screen structure the matrix holes for phosphor deposition are larger than the electron beam spot size of an operating tube. In the negative tolerance type screen structure the matrix holes for phosphor deposition are smaller than the electron beam spot size of an operating tube. Moreover, the positive tolerance type screen structure, which is the least popular structure, is normally fabricated by merely overexposing through the apertured mask associated with present-day "shadow-mask" type structures.

However, the more popular negative tolerance type structure, wherein the matrix holes for phosphor deposition as smaller than the electron beam spot size, are fabricated in accordance with several techniques. In one known process, the structure is exposed through the associated apertured mask to provide matrix holes of a given size and suitable for receiving phosphors. Thereafter, the apertures of the mask are enlarged to provide a beam spot size larger than the matrix holes wherein the phosphors are deposited.

In another known process, a film of photo-sensitive resist is exposed through the apertured mask which has had the apertures partially filled with a liner. Thereafter, the liner is removed to provide enlarged apertures and a beam spot size larger than the matrix holes. In another similar technique, a temporary mask is affixed to the regular apertured mask in order to reduce the aperture size. The matrix holes are exposed and the temporary mask is removed to provide enlarged mask apertures whereby the beam spot size is larger than the matrix holes.

Other known methods for providing negative tolerance structures include an acid etch back process wherein a photo-sensitive resist film is exposed through the normal apertured mask and the exposed film reduced by an acid treatment. Thus, matrix holes of a size smaller than the beam spot size are achieved. Also, underexposure or a "print down" technique is utilized wherein a photo-sensitive resist film is underexposed through the apertured mask and a portion of the underexposed film is washed away to leave a film spot size smaller than the size of an electron beam passing through the same apertured mask and impinging the screen.

Although each of the above-mentioned techniques has been or still is employed for fabricating screens for cathode ray tubes, it has been found that each leaves something to be desired. For example, enlarging the apertures of the mask, filling the apertures with a liner, and utilizing a temporary mask have all been found to be extremely cumbersome, expensive and not particularly satisfactory techniques for fabricating negative tolerance type screen structures. Also, it has been found that acid treatment techniques are most difficult to use due to the problems of size control of the exposed film. Moreover, under-exposure techniques have a tendency to cause deposition of insolubilized film which is relatively thin or which has a tendency to loosen and leave the support to which it is affixed.

OBJECTS AND SUMMARY OF THE INVENTION

An object of the present invention is to provide an enhanced cathode ray tube screen structure fabricating process. Another object of the invention is to provide a cathode ray tube screen structure fabricating process which reduces the above-mentioned disadvantages of the prior art. Still another object of the invention is to provide a cathode ray tube screen structure fabricating process which is inexpensive of labor and materials. A further object of the invention is to provide an improved cathode ray tube screen structure fabricating process for providing a negative tolerance type structure having phosphor receiving areas of a size smaller than the area of an electron beam directed through an apertured mask.

These and other objects, advantages and capabilities are achieved in one aspect of the invention by a cathode ray tube screen structure fabricating process wherein the inner surface of a viewing panel is coated with a first film of photo-sensitive resist material, the first film is exposed to actinic radiation through an apertured mask to provide insoluble areas of film of a given size; a second film of resist material is deposited onto the first, dried, and the second film, soluble areas intermediate the insoluble areas of the first film, and portions of the insoluble areas of the first film are removed to provide insoluble areas of the first film of a size smaller than the given size; a third film of opaque material is overcoated on the insoluble areas of the first film of a size smaller than the given size and the bare surface of the viewing panel intermediate the insoluble areas; the insoluble areas and the overcoating of opaque material thereon are removed; and phosphors are deposited in the remaining areas smaller than the areas of a given size intermediate the coating of opaque materials.

BRIEF DESCRIPTION OF THE DRAWINGS

FIGS. 1a through 1g are cross-sectional views illustrating the cathode ray tube screen structure fabrication process of the invention;

FIG. 2 is a diagrammatic illustration of the mask aperture and insoluble film areas of a control test employing a first film of photo-sensitive resist material; and FIG. 3 is a diagrammatic illustration of the mask aperture and insoluble film areas of a test employing both first and second films of photo-sensitive resist materials.

DESCRIPTION OF THE PREFERRED EMBODIMENT

For a better understanding of the present invention, together with other and further objects, advantages and capabilities thereof, reference is made to the following disclosure and appended claims in connection with the accompanying drawings.

Referring to the drawings, FIG. 1a through 1g illustrate diagrammatically a screen structure fabricated in accordance with the present invention. Although illustrated in the form of dots, other configurations such as slots and stripes are equally appropriate. In FIG. 1a the inner surface of an image viewing panel or face plate 5 is cleaned in the usual manner with a 5–10 percent aqueous solution of hydrofluoric acid and water rinsed.

Therein, a first film 7 of a photo-sensitive resist material is deposited onto the pre-wetted inner surface of the face plate 5. The photo-sensitive resist material is in the form of a clear polyvinyl alcohol (PVA) solution sensitized with a chromatic material such as potassium or ammonium dichromate in an amount of about 0.1 to 0.5 weight percent in an aqueous solution. Preferably, the PVA solution includes PVA solids ranging from about 1½ to 4 weight percent in water. The PVA solids are a blend of materials such as found in Vinol 540 available from the Airco Chemicals and Plastics Division, Air Reduction Co. Inc., New York, N.Y. or Gelvatol 20–90 from Monsanto Co. of St. Louis, Missouri and the coating solution has a viscosity in the range of about 3.0 to 6.0 centipoises.

Having coated the inner surface of the face plate 5 to provide a first film 7 of photo-sensitive resist material, an apertured mask member, 9 of FIG. 1b, is spaced from the first film 7 and an actinic light from a source (not shown) is directed through the apertured mask 9 and onto the first film 7. Thereupon, an insoluble or polymerized area 11 of a size which is usually greater than the size of the apertures of the mask 9 is provided. Moreover, the insoluble or polymerized area 11 is surrounded by the film 7 in a soluble or unpolymerized state. Thus, a plurality of insoluble areas 11 are surrounded by a matrix of soluble film 7.

After providing a first film 7 with a polymerized area 11, a second coating of resist materials is deposited thereon and dried to provide a second film 13 as illustrated in FIG. 1c. This second film 13 may be, but not necessarily need be, of the same form as the photo-sensitive resist material of the first film 7 In other words, a clear PVA solution sensitized with a chromatic material such as ammonium dichromate in an aqueous solution is suitable. However, the second coating may also be in the form of an unsensitized resist material which is insensitive to actinic exposure and does not provide an insoluble area upon exposure. The coating must however be dried after application to provide the second film.

Thereafter, the films on the inner surface of the face plate 5 which include a non-polymerized first film 7; and a polymerized first film area 11; and an unpolymerized second film 13 are developed by rinsing with water. Thereupon, it has been found that the non-polymerized portion of the first film 7 and the non-polymerized second film are removed. Also, it has been found that a portion of the polymerized portion 11 of the first film 7 is washed away during the development process. As a result, there remains a polymerized first film portion, 15 of FIG. 1d, of a size smaller than the size of the apertures of the mask member 9 and smaller than the original polymerized area 11 of the first film 7.

Although the exact mechanism is not completely understood, it has been found that washing away the first and second films 7 and 13 within a period of not more than about 10 minutes after depositing and drying the second film 13 provides a polymerized first film portion 15 of a size in the range of about 15-25% smaller than the original polymerized portion 11 of FIG. 1c. Thus, a polymerized first film portion, 15 of FIG. 1d, of a size smaller than the apertures of the mask member 9 remains affixed to the inner surface of the face plate 5.

Following, the inner surface of the face plate 5 and the polymerized first film portion 15 are overcoated with a third film of an opaque material, 17 of FIG. 1e. Preferably, the third film 17 is derived from an opaque colloidal suspension of graphite. For example, a 22 percent homogenious graphite dispersion in water, such as "aquadag" formulated by Acheson Colloids Company, Port Huron, Michigan, has added thereto water in an amount sufficient to provide a solution having 4–5 weight percent of solids. Moreover, a body builder such as Acrysol G110 and a film former such as Ethylene glycol may be, but not necessarily need be, added to the solution.

After drying, the face plate 5 and polymerized first film portion 15, overcoated with the third film 17 of FIG. 1e of opaque materials, are treated with a compatible water-soluble oxidizing agent to effect an effervescence and degradation of the polymerized first film portion 15. Thereupon, the polymerized first film portion 15 as well as the overcoating of the third film 17 thereon are loosened and removed by pressurized water to provide a multitude of window areas, 19 of FIG. 1f, of a size smaller than the size of the apertures of the mask member 9 surrounded by a web of the third film of opaque materials 17.

More specifically a preferred water-soluble oxidizing agent for degrading the solubilized PVA film, is hydrogen peroxide. Normally, a 10.0 to 20.0 weight percent of an aqueous solution of hydrogen peroxide is applied and allowed to remain for a period of about one to one and one-half (1–1½) minutes at room temperature of about 72 to 78 degrees Fahrenheit. Thus, the bonding of the polymerized PVA to the face plate 5 is destroyed and the polymerized PVA, 15 of FIG. 1e, as well as the overcoating of the third film 17 of opaque materials thereon are removed by pressurized water. Thus, there remains window areas 19 of FIG. 1f, of a size smaller than the apertures of the mask member 9 surrounded by a webbing of the third film of opaque materials 17.

Finally, cathodoluminescent phosphors 21 are deposited in the window areas, 19 of FIG. 1g, to provide a resultant screen structure wherein the cathodoluminescent phosphors are surrounded by a matrix of opaque materials. Moreover, the window areas wherein the phosphors are contained are of a area smaller than the area of the apertures of the mask member.

As an example of test results obtained utilizing the above-described screen structure fabricating process, reference is made to FIGS. 2 and 3 of the drawings. In FIG. 2, which is the control wherein only a single film of PVA is utilized, it can be seen that the apertures of the mask member, as indicated in mils on the drawing, are smaller than the window areas of the screen member. However, in the test case of FIG. 3 wherein a second film is applied to a first film of PVA materials, it can be seen that the window areas are of an area smaller than the area of the apertures of mask member. Moreover, the same exposure table, light sources, aperture mask type, and mask to panel spacing was utilized for both the control and the test results.

Thus, there has been provided a unique color cathode ray tube screen structure fabrication process. Herein, a first film of PVA materials is deposited and exposed. Thereafter, a second film of PVA materials is applied to the first film, dried, and the soluble first and second films as well as a portion of the unsoluble first film are removed by washing to provide window areas of an area smaller than the area of the apertures of a mask member utilized to provide the window areas.

The process is inexpensive of materials and labor and provides an enhanced screen structure suitable for fabricating color cathode ray tube. Also, the process provides an improved screen structure wherein size control of the window areas, thickness of the deposited materials, and adherence of the deposited materials are enhanced. Moreover, very thin and poorly adherent deposited materials common to underexposure as well as poorly controlled window areas common to acid removal techniques are avoided by the above-described process.

While there has been shown and described what is at present considered the preferred embodiments of the invention, it will be obvious to those skilled in the art that various changes and modifications may be made therein without departing from the invention as defined by the appended claims.

What is claimed is:

1. In a cathode ray tube having a viewing panel with an inner surface, a multiple-apertured mask spaced from said inner surface, and a screen structure with a multitude of phosphor receiving areas smaller than said apertures of said mask interconnected by a webbing of opaque material affixed to said inner surface, a screen structure fabricating process comprising the steps of:
    coating said inner surface of said viewing panel with a photo-sensitive resist material to provide a first film capable of solubility alteration upon exposure to actinic radiation;
    exposing said first film to actinic radiation directed through said apertured mask to provide insoluble film areas of a given size interconnected by a webbing of soluble film;
    depositing a coating of resist material over said first film and drying to provide a second film adhered to said first film;
    removing said second film, said soluble portions of the first film and portions of said insoluble areas of said first film to provide insoluble areas of said first film of a size smaller than said given size and interconnected by a bare inner surface of said viewing panel;
    overcoating said bare inner surface of said viewing panel and said insoluble areas smaller than said given size of said first film with a third film of opaque material;
    removing said insoluble areas smaller than said given size of said first film and said overcoating of said third film of opaque material thereon to leave an interconnecting web of opaque materials; and
    depositing phosphor materials on said areas of a size smaller than said given size intermediate said web of opaque materials.

2. The screen structure fabricating process of claim 1 wherein said first and second films are derived from a substantially identical photo-sensitive resist material.

3. The screen structure fabricating process of claim 1 wherein said photo-sensitive resist material is in the form of an aqueous solution of polyvinyl alcohol and an ammonium dichromate sensitizer.

4. The screen structure fabricating process of claim 1 wherein said photo-sensitive resist material is in the form of an aqueous solution including about 2% by weight of polyvinyl alcohol and about 0.25% by weight of an ammonium dichromate sensitizer.

5. The screen structure fabricating process of claim 1 wherein said third film of opaque material is derived from a colloidal suspension of electrically conductive graphite material.

6. The screen structure fabricating process of claim 1 wherein said step of removing said soluble areas smaller than said given size of said first film and said overcoating of said third film thereon includes the utilization of a chemically-digestive agent for said first film.

7. The screen structure fabricating process of claim 1 wherein said step of removing said insoluble areas smaller than said given size of said first film includes the utilization of an aqueous solution of hydrogen peroxide.

8. The screen structure fabricating process of claim 1 wherein said step of removing said second film and said soluble webbing and portions of said insoluble areas of first film provides insoluble first film areas of a size in the range of about 15-25% smaller than said given size.

9. The screen structure fabricating process of claim 8 wherein said provision of insoluble first film areas of a size in the range of about 15-25% smaller than said given size is effected within a period not greater than about 10 minutes after said step of depositing a coating of resist material over said first film and drying to provide a second film adhered thereto.

10. A process for fabricating a screen structure affixed to the inner surface of the viewing panel of a cathode ray tube having an apertured mask spaced from said inner surface, said screen structure fabricating process comprising the steps of:
    providing a first film of photo-sensitive resist material capable of solubility alteration upon exposure to actinic radiation on said inner surface of said viewing panel;
    exposing said first film to actinic radiation directed through said apertured mask to provide insoluble areas of said first film of a given size interconnected by a webbing of soluble first film material;
    coating said first film with a resist material and drying to provide a second film affixed to said first film;
    removing said second film, said webbing of soluble first film material, and portions of said insoluble areas of said first film to provide insoluble areas of said first film of a size smaller than said given size and interconnected by a bare inner surface of said viewing panel;
    overcoating said first film insoluble areas smaller than said given size and said interconnecting bare inner surface of said face place with a third film of opaque material;
    applying a chemically-digestive agent to effect removal of said first film insoluble areas smaller than said given size and said overcoating of opaque material thereon; and
    depositing phosphor materials into said areas of a size smaller than said given size wherefrom said first film and over-coating of said third film were removed.

11. The screen fabricating process of claim 10 including the step of wetting said exposed first film with water prior to coating said first film with a second film of resist material.

12. The screen fabricating process of claim 10 wherein said coating of said first film to provide a second film is effected with the photo-sensitive resist material of said first film.

13. The screen fabricating process of claim 1 wherein said photo-sensitive resist material in the form of an aqueous solution including about 2% by weight of polyvinyl alcohol and about 0.25% by weight of ammonium dichromate.

14. The screen fabricating process of claim 10 wherein said step of coating said first film with a resist material to provide a second film is effected within a period not greater than about 10 minutes after said step of providing a first film of photo-sensitive resist materials; and exposure to actinic radiation.

15. The screen fabricating process of claim 10 wherein said step of removing said second film, said webbing of soluble first film, and portions of said insoluble areas of said first film provides insoluble areas of said first film of a size in the range of about 15-25% smaller than said given size.

* * * * *